United States Patent
Kawabe (10) Patent No.: US 9,075,322 B2
(45) Date of Patent: Jul. 7, 2015

(54) REFLECTIVE IMAGING OPTICAL SYSTEM, EXPOSURE APPARATUS, AND METHOD FOR PRODUCING DEVICE

(75) Inventor: Yoshio Kawabe, Kumagaya (JP)

(73) Assignee: Nikon Corporation, Tokyo (JP)

( * ) Notice: Subject to any disclaimer, the term of this patent is extended or adjusted under 35 U.S.C. 154(b) by 426 days.

(21) Appl. No.: 13/225,629

(22) Filed: Sep. 6, 2011

(65) Prior Publication Data

US 2012/0062864 A1    Mar. 15, 2012

Related U.S. Application Data

(60) Provisional application No. 61/381,586, filed on Sep. 10, 2010.

(51) Int. Cl.
*G03B 27/54* (2006.01)
*G03F 7/20* (2006.01)

(52) U.S. Cl.
CPC ................... *G03F 7/70233* (2013.01)

(58) Field of Classification Search
CPC .................................................. G03F 7/70233
USPC .......................... 355/53, 67–71; 359/857–861
See application file for complete search history.

(56) References Cited

U.S. PATENT DOCUMENTS

| | | | |
|---|---|---|---|
| 6,198,793 B1 | 3/2001 | Schultz et al. | |
| 6,400,794 B1 | 6/2002 | Schultz et al. | |
| 6,556,648 B1 | 4/2003 | Bal et al. | |
| 6,781,671 B2 | 8/2004 | Komatsuda | |
| 7,372,624 B2 * | 5/2008 | Mann et al. | 359/365 |
| 7,682,031 B2 * | 3/2010 | Mann et al. | 359/859 |
| 2002/0093636 A1 | 7/2002 | Komatsuda | |
| 2006/0232867 A1 | 10/2006 | Mann et al. | |
| 2007/0296936 A1 | 12/2007 | Kato et al. | |
| 2008/0316451 A1 | 12/2008 | Mann et al. | |
| 2009/0122381 A1 | 5/2009 | Owa et al. | |
| 2010/0134908 A1 | 6/2010 | Mann et al. | |

FOREIGN PATENT DOCUMENTS

| | | |
|---|---|---|
| EP | 0 955 641 A1 | 11/1999 |
| WO | WO 2006/069725 A1 | 7/2006 |

OTHER PUBLICATIONS

International Search Report in International Application No. PCT/JP2011/071166; Mailing Date: Oct. 31, 2011.
Written Opinion of the International Searching Authority in International Application No. PCT/JP2011/071166; Mailing Date: Oct. 31, 2011.

* cited by examiner

*Primary Examiner* — Hung Henry Nguyen
(74) *Attorney, Agent, or Firm* — Finnegan, Henderson, Farabow, Garrett & Dunner, LLP (57) ABSTRACT

An reflective imaging optical system of the far pupil type, which is applicable to an exposure apparatus using for example the EUV light, forms on a second plane an image of a predetermined area on a first plane and is provided with first to eighth reflecting mirrors arranged in an order of reflection from the first plane toward the second plane. An entrance pupil of reflective imaging optical system is positioned on a side opposite to the reflective imaging optical system with the first plane intervening therebetween; and the following condition is fulfilled provided that PD represents a distance along an optical axis between the entrance pupil and the first plane, TT represents a distance along the optical axis between the first plane and the second plane, and R represents an angle of incidence of a main light beam coming into the first plane: $-14.3 < (PD/TT)/R < -2.5$.

49 Claims, 7 Drawing Sheets

REFLECTIVE IMAGING OPTICAL SYSTEM, EXPOSURE APPARATUS, AND METHOD FOR PRODUCING DEVICE

CROSS-REFERENCE TO RELATED APPLICATION

This application claims the benefit of priority of U.S. Provisional Application Ser. No. 61/381,586 filed on Sep. 10, 2010, and the disclosure of U.S. Provisional Application Ser. No. 61/381,586 is incorporated herein by reference in its entirety.

BACKGROUND OF THE INVENTION

1. Field of the Invention

The present invention relates to a reflective (catoptric) imaging optical system, an exposure apparatus, and a method for producing a device. More specifically, the present invention relates to a reflective imaging optical system preferably useable for an exposure apparatus which uses, for example, the EUV light (EUV light beam) and transfers, onto a photosensitive substrate, a circuit pattern on a mask for example in accordance with the mirror projection system.

2. Description of the Related Art

Attention is directed to an EUVL (Extreme UltraViolet Lithography) exposure apparatus which uses the EUV (Extreme UltraViolet) light having a wavelength of, for example, about 5 nm to 40 nm as an exposure apparatus to be used for producing semiconductor elements, etc. In a case that the EUV light is used as the exposure light (exposure light beam), any usable transmissive optical material and any useable dioptric optical material are absent. Therefore, a reflection type mask is used, and a reflective optical system (optical system constructed of only reflecting members) is used as a projection optical system.

Conventionally, it has been suggested that a reflective optical system, which has an entrance pupil disposed on a side opposite to the optical system with an object plane intervening therebetween, is used as a reflective imaging optical system applicable to a projection optical system of an EUV exposure apparatus, in place of a reflective optical system which has an entrance pupil disposed on a side of the optical system with an object plane intervening therebetween (see, for example, U.S. Pat. No. 6,781,671). In the following description of this specification, the "reflective imaging optical system having the entrance pupil disposed on the side of the optical system with the object plane intervening therebetween" is referred to as "reflective imaging optical system of the near pupil type", and the "reflective imaging optical system having the entrance pupil disposed on the side opposite to the optical system with the object plane intervening therebetween" is referred to as "reflective imaging optical system of the far pupil type". In other word, the former is also referred to as "reflective imaging optical system of the normal pupil type" and the latter is also referred to as "reflective imaging optical system of the opposite pupil type".

The reflective imaging optical system of the far pupil type disclosed in U.S. Pat. No. 6,781,671 is constructed of eight pieces of mirrors. Not only in the EUV exposure apparatus but also in an exposure apparatus of general type, there is a demand to increase the numerical aperture of the projection optical system so as to improve the resolving power. In order to increase the numerical aperture of the reflective imaging optical system, it is necessary to increase a parameter for correcting the aberration by increasing the number of mirrors constructing the optical system. However, increase in the number of the mirror leads to increase in the light loss (optical loss), which in turn lowers the throughput of the apparatus.

The present invention has been made taking the foregoing problems into consideration, an object of which is to provide a reflective imaging optical system of the far pupil type as a reflective optical system which is applicable, for example, to an exposure apparatus using the EUV light and which has a large numerical aperture. Further, an object of the present invention is to provide a reflective imaging optical system of the far pupil type in which the aberration is corrected satisfactorily. Still another object of the present invention is to perform the projection exposure at a high resolution while securing a large resolving power by using, for example, the EUV light as an exposure light, with the application of the reflective imaging optical system of the far pupil type of the present invention to a projection optical system of an exposure apparatus.

SUMMARY OF THE INVENTION

In order to solve the problems as described above, according to a first aspect of the present invention, there is provided a reflective imaging optical system which forms, on a second plane, an image of a predetermined area on a first plane, the reflective imaging optical system comprising:

a first reflecting mirror, a second reflecting mirror, a third reflecting mirror, a fourth reflecting mirror, a fifth reflecting mirror, a sixth reflecting mirror, a seventh reflecting mirror and an eighth reflecting mirror which are arranged in an order of reflection from the first plane toward the second plane; and an entrance pupil which is positioned on a side opposite to the reflective imaging optical system with respect to the first plane intervening therebetween;

wherein the following condition is fulfilled provided that PD represents a distance along an optical axis between the entrance pupil and the first plane, TT represents a distance along the optical axis between the first plane and the second plane, and R represents an angle of incidence (rad) of a main light beam coming into the first plane:

$$-14.3 < (PD/TT)/R < -2.5.$$

According to a second aspect of the present invention, there is provided a reflective imaging optical system which forms, on a second plane, an image of a predetermined area on a first plane, the reflective imaging optical system comprising:

a first reflecting mirror, a second reflecting mirror, a third reflecting mirror, a fourth reflecting mirror, a fifth reflecting mirror, a sixth reflecting mirror, a seventh reflecting mirror and an eighth reflecting mirror which are arranged in an order of reflection from the first plane toward the second plane; and an entrance pupil which is positioned on a side opposite to the reflective imaging optical system with respect to the first plane intervening therebetween;

wherein the first to third reflecting mirrors are arranged on a side of the predetermined area with respect to an optical axis.

According to a third aspect of the present invention, there is provided an exposure apparatus comprising an illumination optical system which illuminates a predetermined pattern arranged on the first plane with a light from a light source, and the reflective imaging optical system as defined in the first aspect or the second aspect which projects the predetermined pattern onto a photosensitive substrate arranged on the second plane.

According to a fourth aspect of the present invention, there is provided a method for producing a device, comprising: exposing the photosensitive substrate with the predetermined pattern by using the exposure apparatus as defined in the third aspect; developing the photosensitive substrate to which the predetermined pattern has been transferred to form a mask layer, which has a shape corresponding to the predetermined pattern, on a surface of the photosensitive substrate; and processing the surface of the photosensitive substrate via the mask layer.

In the reflective imaging optical system, according to an aspect of the present invention, which is provided as the optical system of the far pupil type constructed of eight pieces of mirrors, the required condition is fulfilled by the distance PD which is provided along the optical axis between the entrance pupil and the first plane, the distance TT which is provided along the optical axis between the first plane and the second plane, and the angle of incidence R of the main light beam which comes (is allowed to come) into the first plane. Accordingly, it is possible to realize the reflective imaging optical system of the far pupil type having a large numerical aperture. Further, it is possible to realize an optical system in which the aberration is satisfactorily corrected.

In the reflective imaging optical system, according to another aspect of the present invention, which is provided as the optical system of the far pupil type constructed of eight pieces of mirrors, the first to third reflecting mirrors are arranged on a side of the predetermined area with respect to the optical axis. Accordingly, it is possible to correct the aberration satisfactorily. Further, it is possible to secure the distance between an illumination area and the optical axis to be relatively great, which consequently makes it possible to secure the entrance pupil distance PD with a predetermined size or length.

In a case that the reflective imaging optical system of the present invention is applied to the exposure apparatus, the EUV light (EUV light beam), which has a wavelength of, for example, 5 nm to 40 nm, can be used as the exposure light (exposure light beam). In this case, the pattern of the mask can be projected onto the photosensitive substrate to expose the photosensitive substrate therewith at a high resolution by relatively moving the photosensitive substrate and the pattern of the mask to be transferred relative to the reflective imaging optical system. As a result, a highly accurate device can be produced under the satisfactory exposure condition by using the scanning type exposure apparatus having a large resolving power.

DESCRIPTION OF THE EMBODIMENTS

Figure 1:
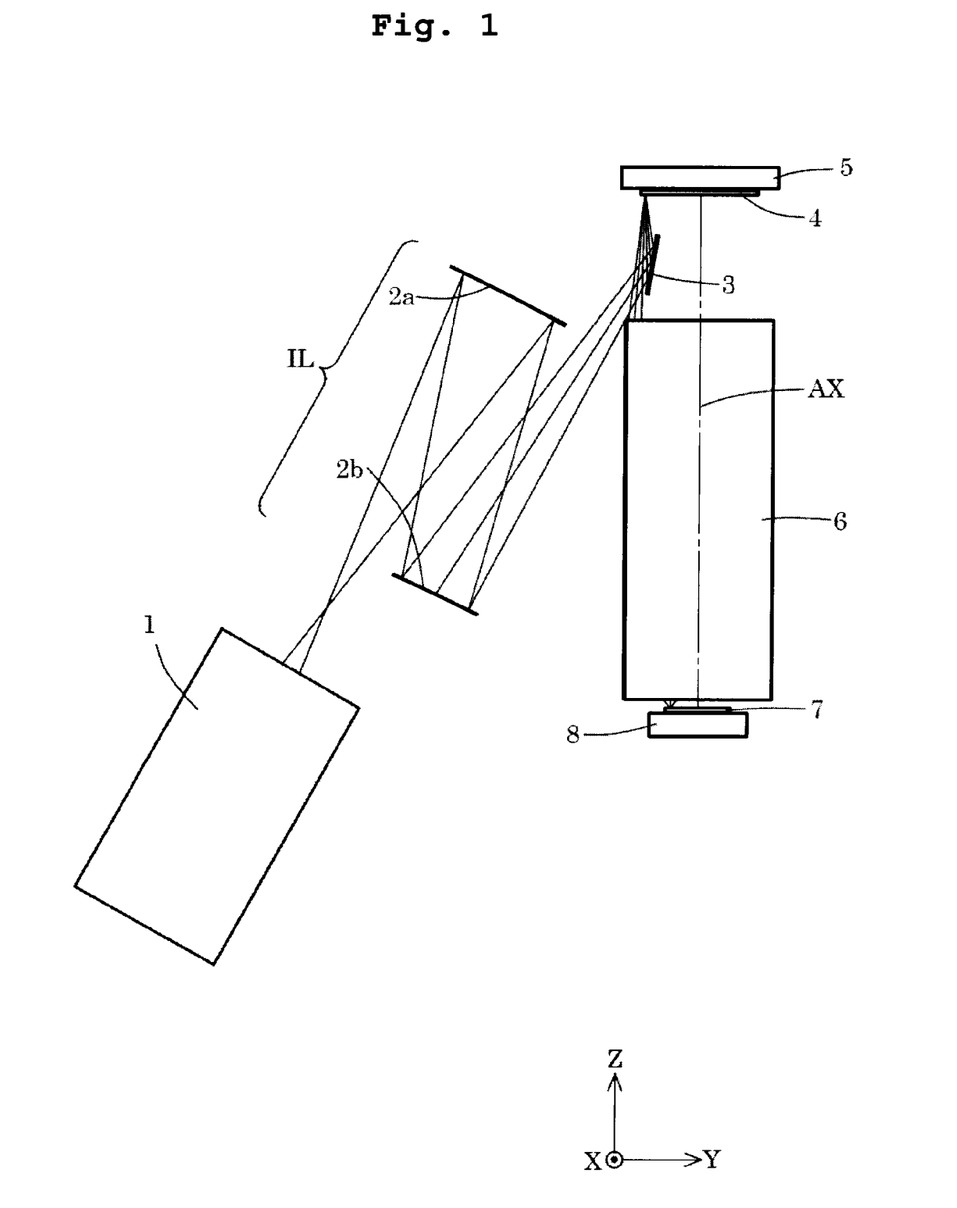
FIG. 1 schematically shows a construction of an exposure apparatus according to an embodiment of the present invention.
Figure 2:
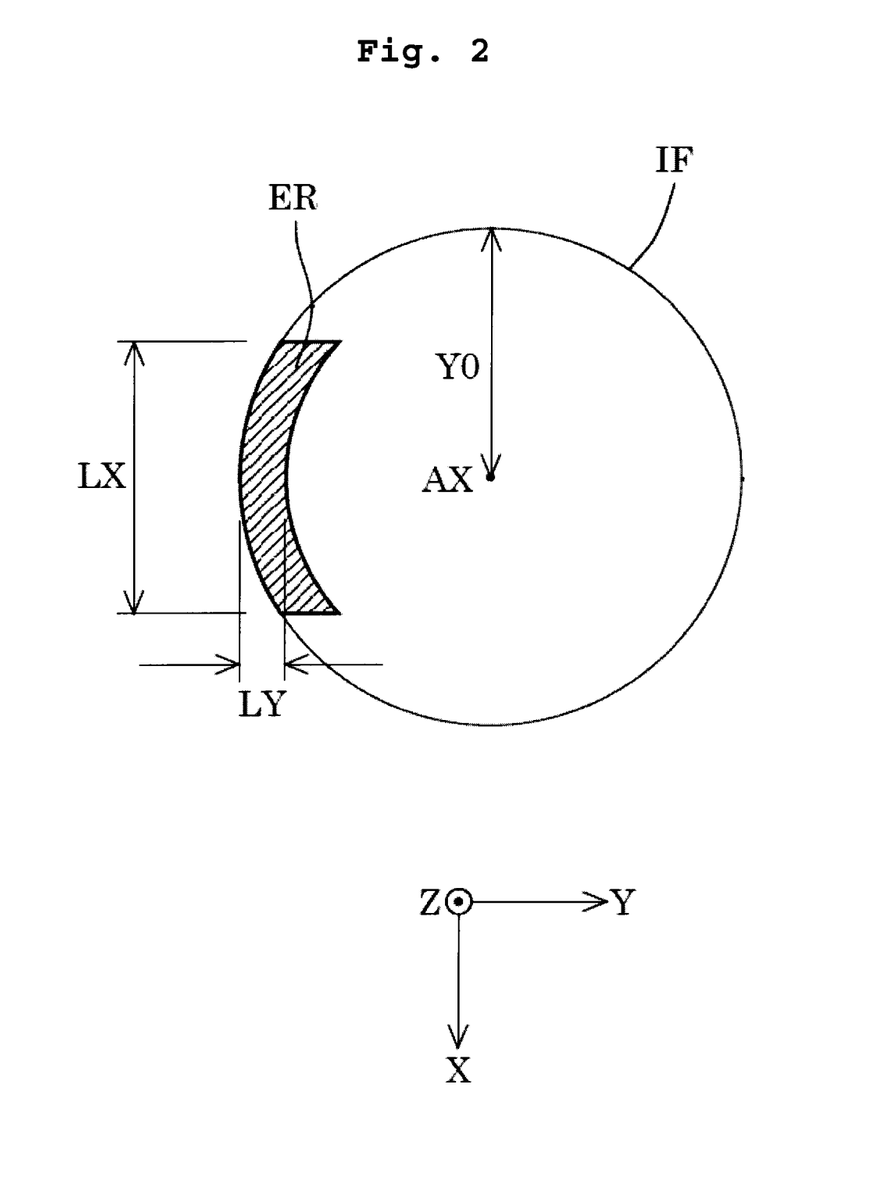
FIG. 2 shows a positional relationship between an optical axis and a circular arc-shaped effective imaging area formed on a wafer.

An embodiment of the present invention will be explained based on the accompanying drawings. FIG. 1 schematically shows a construction of an exposure apparatus according to the embodiment of the present invention. FIG. 2 shows a positional relationship between an optical axis and a circular arc-shaped effective imaging area formed on a wafer. In FIG. 1, the Z axis is defined in the direction of the optical axis AX of a reflective imaging optical system 6, i.e., in the normal line direction of an exposure surface (transfer surface) of the wafer 7 provided as a photosensitive substrate, the Y axis is defined in the direction parallel to the sheet surface of FIG. 1 in the exposure surface of the wafer 7, and the X axis is defined in the direction perpendicular to the sheet surface of FIG. 1 in the exposure surface of the wafer 7.

With reference to FIG. 1, a light source 1 which is provided to supply the exposure light includes, for example, a laser plasma X-ray source. Those usable as the light source 1 include discharge plasma light sources and other X-ray sources. The light (light beam) radiated from the light source 1 comes into an illumination optical system IL, via an optionally arranged wavelength selection filter (not shown). The wavelength selection filter has such a characteristic that only the EUV light having a predetermined wavelength (for example, 13.5 nm), which is included in the lights supplied by the light source 1, is selectively transmitted through the wavelength selection filter, and the transmission of the lights having other wavelengths is shielded or shut off by the wavelength selection filter. The EUV light via (which is allowed to pass through) the wavelength selection filter is guided to an optical integrator which is constructed of a pair of fly's eye optical systems (fly's eye mirrors) $2a$, $2b$. Note that instead of providing the wavelength selection filter, it is allowable to form a multi-layered film, which reflects only a EUV light having a predetermined wavelength, on a reflecting plane (reflecting surface) of a mirror which reflects generated EUV light or to which the generated EUV light is collected. Since there is no need to provide any wavelength selection filter, it is possible to realize a compact-sized light source 1. Further, it is possible to prevent the light amount loss in the EUV light in the wavelength selection filter.

The first fly's eye optical system $2a$ has a plurality of first reflecting optical elements which are arranged in juxtaposition or in parallel. The second fly's eye optical system $2b$ has a plurality of second reflecting optical elements which are arranged in juxtaposition or in parallel to correspond to the plurality of first reflecting optical elements of the first fly's eye optical system $2a$. Specifically, the first fly's eye optical system $2a$ is constructed, for example, by arranging a large number of concave mirror elements, having circular arc-shaped outer shapes, densely, laterally and longitudinally. The second fly's eye optical system $2b$ is constructed, for example, by arranging a large number of concave mirror elements, which have rectangular outer shapes, densely, laterally and longitudinally. Reference may be made, for example, to United States Patent Application Publication No. 2002/0093636 A1 about detailed construction and function of the fly's eye optical systems $2a$, $2b$. The contents of United States Patent Application Publication No. 2002/0093636 A1 are incorporated herein by reference in their entirety.

Thus, a substantial surface light source, which has a predetermined shape, is formed in the vicinity of the reflecting surface of the second fly's eye optical system $2b$. The substantial surface light source is formed at the position of the exit pupil (exit pupil position) of the illumination optical system IL constructed of the pair of fly's eye optical systems 2a, 2b. The exit pupil position of the illumination optical system IL (i.e., the position in the vicinity of the reflecting surface of the second fly's eye optical system 2b) is coincident with the position of the entrance pupil of the reflective imaging optical system (projection optical system) 6 of the far pupil type.

The light from the substantial surface light source, i.e., the light exiting or irradiated from the illumination optical system IL is reflected by an oblique incidence mirror 3, and then the light forms a circular arc-shaped illumination area on a reflection type mask 4 via a circular arc-shaped aperture (light-transmitting portion) of a field stop (not shown) which is arranged closely to the reflection type mask 4 substantially in parallel thereto. In this way, the light source 1 and the illumination optical system IL (2a, 2b) constitute an illumination system which is provided to perform the Koehler illumination for the mask 4 provided with a predetermined pattern. No reflecting mirror having any power is arranged in the optical path between the second fly's eye optical system 2b and the mask 4. The power of the reflecting mirror is a reciprocal of the focal length or focal distance of the concerning reflecting mirror. It is a matter of course that the reflecting mirror having any power may be arranged.

The mask 4 is held by a mask stage 5 which is movable in the Y direction so that the pattern surface of the mask 4 extends along the XY plane. The movement of the mask stage 5 is measured by a laser interferometer and an encoder which are omitted from the illustration. For example, a circular arc-shaped illumination area, which is symmetrical in relation to the Y axis, is formed on the mask 4. The light, which comes from the illuminated mask 4, forms a pattern image of the mask 4 on a wafer 7 as a photosensitive substrate, via the reflective imaging optical system 6.

That is, as shown in FIG. 2, a circular arc-shaped effective imaging area (static exposure area) ER, which is symmetrical in relation to the Y axis, is formed on the wafer 7. With reference to FIG. 2, the circular arc-shaped effective imaging area ER, which has a length LX in the X direction and which has a length LY in the Y direction, is formed so that the circular arc-shaped effective imaging area ER is brought in contact with an image circle IF in the circular area (image circle) IF which has a radius Y0 about the center of the optical axis AX. The circular arc-shaped effective imaging area ER is a part of the annular or zonal area provided about the center of the optical axis AX. The length LY is the widthwise dimension of the effective imaging area ER provided in the direction connecting the optical axis and the center of the circular arc-shaped effective imaging area ER.

The wafer 7 is held by a wafer stage 8 which is two-dimensionally movable in the X direction and the Y direction so that the exposure surface of the wafer 7 extends along the XY plane. The movement of the wafer stage 8 is measured by a laser interferometer and an encoder which are omitted from the illustration, in the same manner as the mask stage 5. Thus, the scanning exposure (scanning and exposure) is performed while moving the mask stage 5 and the wafer stage 8 in the Y direction, i.e., relatively moving the mask 4 and the wafer 7 in the Y direction with respect to the reflective imaging optical system 6. By doing so, the pattern of the mask 4 is transferred to an exposure area of the wafer 7.

In a case that the projection magnification (transfer magnification) of the reflective imaging optical system 6 is ¼, the synchronous scanning is performed by setting the movement velocity of the wafer stage 8 to ¼ of the movement velocity of the mask stage 5. The pattern of the mask 4 is successively transferred to the respective exposure areas of the wafer 7 by repeating the scanning exposure while two-dimensionally moving the wafer stage 8 in the X direction and the Y direction.

Figure 3:
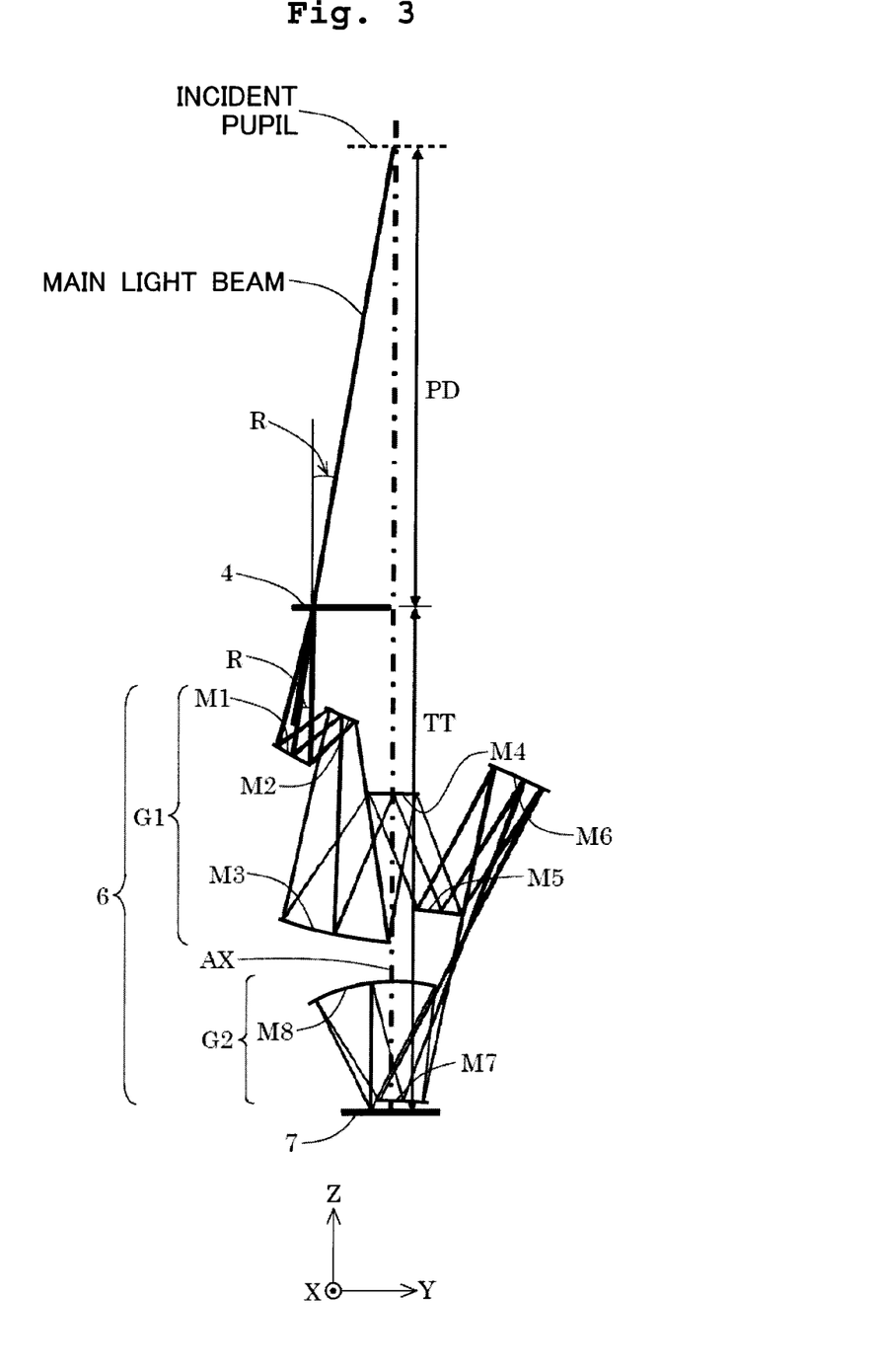
FIG. 3 schematically shows a basic construction of reflective imaging optical systems according to respective specified embodiments concerning the embodiment of the present invention.

In the embodiment of the present invention, as shown in FIG. 3, the reflective imaging optical system 6 concerning each of specified embodiments includes, along the single optical axis AX extending in a form of straight line, a first reflective optical system G1 which forms an intermediate image of the pattern at a position optically conjugate with the pattern surface of the mask 4 (hereinafter referred also to as "mask surface"), and a second reflective optical system G2 which forms, on a transfer surface of the wafer 7 (hereinafter referred also to as "wafer surface"), a final reduced image (image of the intermediate image) of the pattern of the mask 4. That is, the position, which is optically conjugate with the illumination area on the pattern surface of the mask 4, is formed in the optical path between the first reflective optical system G1 and the second reflective optical system G2. Further, in the embodiment, any optically conjugate position is not formed in the optical path between the first reflecting mirror and the sixth reflecting mirror. Accordingly, is it possible to suppress the angle of incidence of a light (light beam) coming into the reflecting surface of each of the reflecting mirrors constructing the first reflective optical system G1 to be small (from becoming large), thereby making it possible to suppress the lowering of the reflectance on the respective reflecting surfaces. Further, it is possible to correct the aberration satisfactorily.

For example, in a case that one more image of the intermediate image is formed in the first reflective optical system G1 (such a configuration may be referred to as "thrice image forming system"), the optical axis AX needs to be straddled every time an intermediate image is formed. This causes the angle of incidence at each of the reflecting surface to be great, which in turn causes lowering of the reflectance and also worsens the aberration.

The first reflective optical system G1 includes a first reflecting mirror M1 which has a concave (concave surface-shaped) reflecting surface or a convex (convex surface-shaped) reflecting surface, a second reflecting mirror M2 which has a convex reflecting surface or a concave reflecting surface, a third reflecting mirror M3 which has a concave reflecting surface or a convex reflecting surface, a fourth reflecting mirror M4 which has a convex reflecting surface or a concave reflecting surface, a fifth reflecting mirror M5 which has a convex reflecting surface, and a sixth reflecting mirror M6 which has a concave reflecting surface as referred to in an order of the incidence of the light (in an order of reflection from the mask 4 toward the wafer 7). The second reflective optical system G2 includes a seventh reflecting mirror M7 which has a convex reflecting surface, and a eighth reflecting mirror M8 which has a concave reflecting surface as referred to in an order of the incidence of the light.

An aperture stop AS (not shown) is provided at a position at which the reflecting surface of the fourth reflecting mirror M4 is located or at a position in the vicinity thereof. The aperture stop AS is capable of setting the numerical aperture of the reflective imaging system 6 by limiting the light flux of the exposure light. For example, the aperture stop AS is constructed of a variable aperture stop capable of adjusting the dimension or size of the aperture (aperture size); a switching member provided with a plurality of apertures having mutually different size, shape, etc., and capable of performing switching of a desired aperture among the plurality of apertures; and the like.

By arranging the aperture stop AS at the position at which the reflecting surface of the fourth reflecting mirror M4 is located or at the position in the vicinity of the reflecting surface, it is possible to easily perform optical line separation for at least one of an incident light (incident light beam) coming into the aperture stop AS and the fourth reflecting mirror M4 and an exit light (exit light beam) exiting or outgoing from the aperture stop AS and the fourth reflecting mirror M4. Further, a configuration is adopted in which the arrangement of the first to third reflecting mirrors M1 to M3 are adjusted so as to secure the distance between the illumination-area and the optical axis AX. By using this configuration, it is possible to easily perform optical line separation from the first reflecting mirror M1 to the third reflecting mirror M3, and also is possible to correct the aberration satisfactorily. Further, the angle of incidence to the reflecting surface of at least one of the first reflecting mirror M1, the second reflecting mirror M2, the third reflecting mirror M3, the fifth reflecting mirror M5 and the sixth reflecting mirror M6 is suppressed from becoming great (suppressed to be small), thereby making it possible to suppress the lowering of the reflectance on the reflecting surface.

Note that the aperture stop AS may be arranged at a position at which the reflecting surface of the third reflecting mirror M3 is located or at a position in the vicinity thereof, at a position at which the reflecting surface of the fifth reflecting mirror M5 is located or at a position in the vicinity thereof, or in the optical path between the third reflecting mirror M3 and the fifth reflecting mirror M5.

In each of the embodiments, the entrance pupil of the reflective imaging optical system 6 does not have any shielding area. Accordingly, a diffracted light (diffracted light beam) from the mask pattern is not shielded by the shielding area, thereby making it possible to suppress the imaging performance for a specific pattern from being degraded. For example, the first reflecting mirror M1 to the eighth reflecting mirror M8 constructing the reflective imaging optical system 6 are not provided with any shielding portion, such as film, hole, which shields the diffracted light from the mask pattern.

In the reflective embodiments, a light from a predetermined area (illumination area) which is separated from the optical axis AX in the −Y direction on the pattern surface of the mask 4 (first plane) is successively reflected by the reflecting surface of the first reflecting mirror M1, the reflecting surface of the second reflecting mirror M2, the reflecting surface of the third reflecting mirror M3, the reflecting surface of the fourth reflecting mirror M4, and the reflecting surface of the fifth reflecting mirror M5, and the reflecting surface of the sixth reflecting mirror M6, and then the intermediate image of the mask pattern is formed. The light from the intermediate image formed via the first reflective optical system G1 is successively reflected by the reflecting surface of the seventh reflecting mirror M7 and the reflecting surface of the eighth reflecting mirror M8, and then forms an reduced image of the mask pattern at an area (effective imaging area ER) which is separated from the optical axis AX in the −Y direction on the surface of the wafer 7 (second plane).

In the respective specified embodiments, the eight mirrors which are the first to eighth reflecting mirrors M1 to M8 constructing the reflective imaging optical system 6 are arranged so that the centers of curvature (curvature centers) of the reflecting surfaces of the first to eighth reflecting mirrors M1 to M8 are positioned on the optical axis AX having a form of straight line. The reflecting mirrors M1 to M8 have the reflecting surfaces each of which is formed to have an aspherical reflecting surface along the rotationally symmetric surface in relation to the optical axis AX. In a case that the reflecting surface is formed to be an aspherical surface, it is possible to use the paraxial curvature center as the curvature center of the reflecting surface. In the vicinity of the intersection point between the axis of rotational symmetry and the aspherical reflecting surface, the aspherical surface may be considered as a spherical surface, and the curvature center on this spherical surface is referred to as the paraxial curvature center (apex curvature center).

In the respective specified embodiments, the reflective imaging optical system 6 is the optical system which is substantially telecentric on the side of the wafer (on the side of the image). In other words, in the respective specified embodiments, the main light beam, which arrives at the respective positions on the image plane of the reflective imaging optical system 6, is substantially perpendicular to the image plane. Owing to this construction, the imaging can be performed satisfactorily even when irregularities (protrusions and recesses) are present on the wafer within the depth of focus of the reflective imaging optical system 6. The reflective imaging optical system 6 concerning each of the specified embodiments is the reflective imaging optical system of the far pupil type which has the entrance pupil, at the position separated by a predetermined distance, on the side opposite to the reflective imaging optical system 6 with the mask 4 intervening therebetween.

In the embodiment of the present invention, the following conditional expression (1) is fulfilled by the distance PD (entrance pupil distance PD) along the optical axis between the pattern surface (the mask surface: first plane) of the mask 4 and the entrance pupil of the reflective imaging optical system 6 of the far pupil type, the distance TT (total distance TT) along the optical axis between the mask surface and the transfer surface (wafer surface: second plane) of the wafer 7, and the angle of incidence R (rad) of the main light beam coming into the mask surface. It is presumed that the angle of incident R takes a negative value in a case that the main light beam reflected by the mask surface travels or advances in a direction separating away from the optical axis AX.

$$-14.3 < (PD/TT)/R < -2.5 \tag{1}$$

The three parameters which define the conditional expression (1), namely the total length TT, the entrance pupil distance PD and the angle of incidence R need to fulfill the following preconditions as represented by the following expressions (1A), (1B) and (1C), respectively. Therefore, a ratio PD/DD which is the ratio of the entrance pupil distance PD to the total length TT of the reflective imaging optical system needs to fulfill the following conditional expression (1D). The expression (1) is derived from the relationship shown in the conditional expression (1C) and the relationship shown in the conditional expression (1D).

$$1300 \text{ mm} < TT < 4000 \text{ mm} \tag{1A}$$

$$TT \times 0.5 < PD < TT \times 1.5 \tag{1B}$$

$$-0.180 \text{ rad} < R < -0.105 \text{ rad} \tag{1C}$$

$$0.5 < PD/TT < 1.5 \tag{1D}$$

With respect to the conditional expression (1C), if the angle of incidence R of the main light beam coming into the mask surface becomes greater than −0.105 rad and approximates to 0 (zero), namely if the absolute value of the angle of incidence R becomes smaller than 0.105 rad, then it is difficult to avoid the interference between the incident light flux coming into the mask surface and the reflected light flux from (reflected off) the mask surface. On the other hand, if the angle of incidence R of the main light beam coming into the mask surface becomes smaller than −0.180 rad, namely if the absolute value of the angle of incidence R becomes greater than 0.180 rad, then not only that the influence due to the shadow of a stepped portion forming the mask pattern becomes great but also the reflectance on the mask surface is lowered.

With respect to the conditional expression (1D), if the PD/TT becomes smaller than 0.5, then the distance (spacing distance) between the first fly's eye optical system 2a and the second fly's eye optical system 2b becomes narrow or small, and the angle of incident of the light flux coming into the fly's eye optical systems 2a, 2b becomes excessively great. As a result, the reflectance in the fly's eye optical systems 2a and 2b is lowered, consequently lowering the throughput of the apparatus. If the PD/TT becomes greater than 1.5, then the second fly's eye optical system 2b is located to be lower than the wafer stage 8, and the light flux traveling or advancing from the second fly's eye optical system 2b to the oblique incidence mirror 3 interferes with the wafer stage 8.

In the embodiment, the entrance pupil distance PD, the total length TT of the optical system and the angle of incidence R of the main light beam coming into the mask surface fulfill the conditional expression (1) in the optical system of the far pupil type constructed of the eight mirrors, thereby making it possible to realize an optical system having a large numerical aperture, as well as to realize an optical system in which the aberration is corrected satisfactorily. Note that in order to exhibit the effects of the embodiment more satisfactorily, it is also possible to set the upper limit value of the conditional expression (1) to be −2.7, and to set the lower limit value of the conditional expression (1) to be −12.0. Further, in order to exert the effects of the embodiment more satisfactorily, it is also possible to set the upper limit value of the conditional expression (1) to be −3.0, and to set the lower limit value of the conditional expression (1) to be −10.0.

Figure 4:
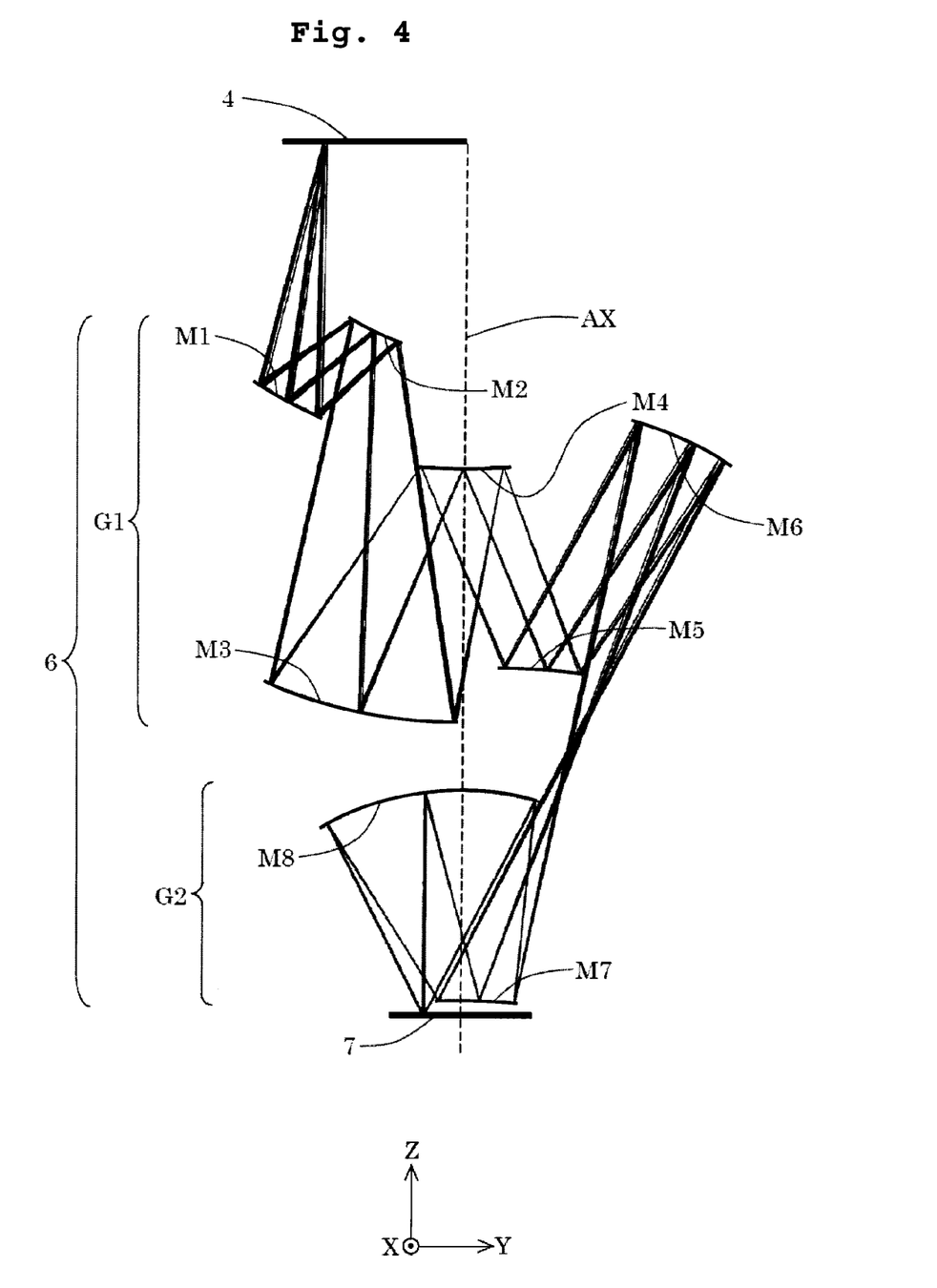
FIG. 4 schematically shows a construction of a reflective imaging optical system according to a first embodiment.
Figure 5:
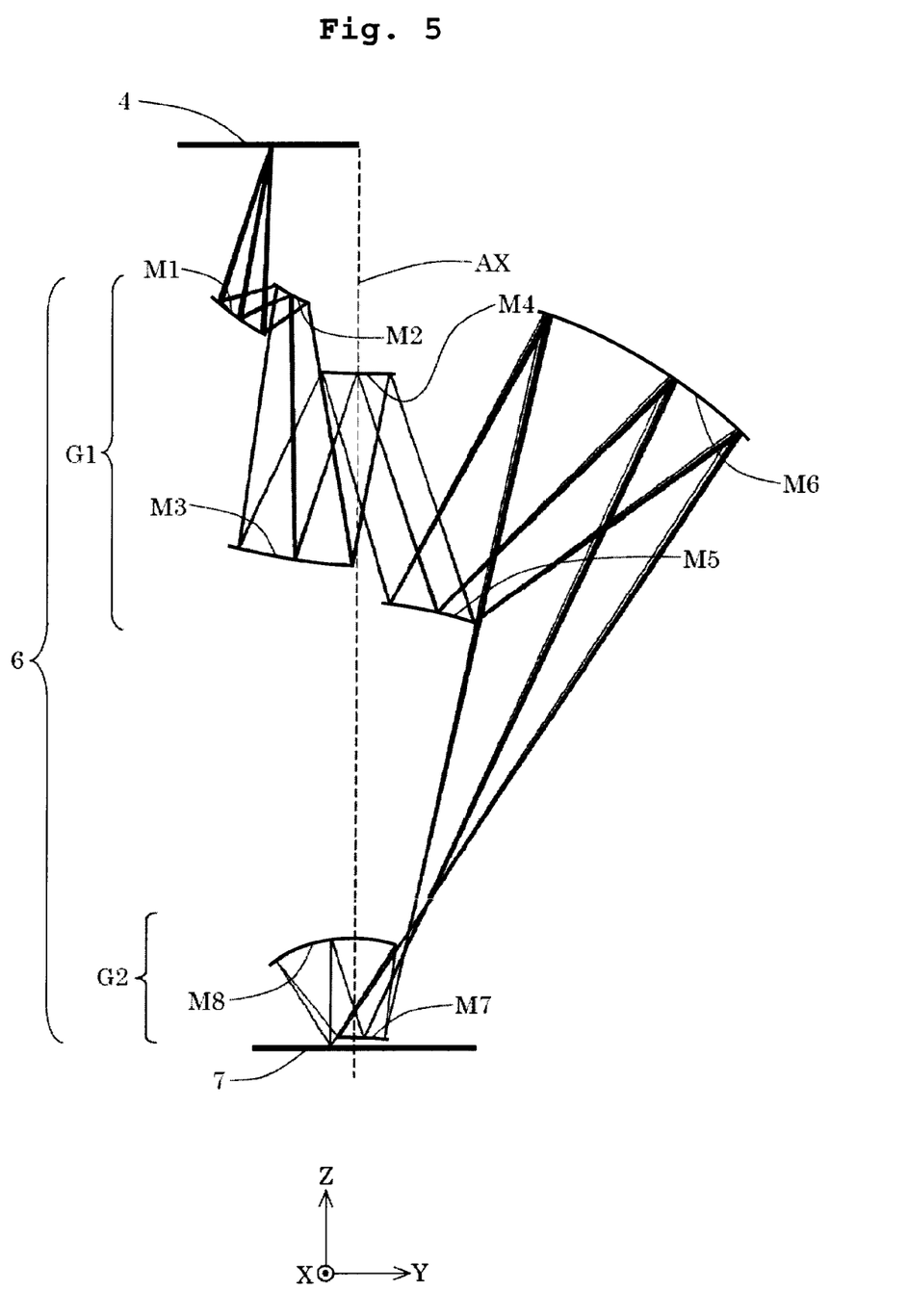
FIG. 5 schematically shows a construction of a reflective imaging optical system according to a second embodiment.

In the first and second embodiments of the present invention, the first reflecting mirror M1 has a concave reflecting surface, the second reflecting mirror M2 has a convex reflecting surface, the third reflecting mirror M3 has a concave reflecting surface. With this configuration, the second reflecting mirror M2 can be made to be compact or small-sized in the radial direction of the second reflecting mirror M2 (in the radial direction of a circle with the optical axis AX as the center), thereby consequently making it possible to make the reflective imaging optical system 6 to be small-sized in the radial direction thereof.

In the respective specified embodiments, the effective areas of the reflecting surfaces of the first to third reflecting mirrors M1 to M3 are arranged only on the side of the illumination area of the mask 4 with respect to (from) the optical axis AX, without intersecting or crossing the optical axis AX. With this configuration, it is possible to correct the aberration with the three reflecting mirrors M1 to M3. Further, it is also possible to secure a relatively large distance between the illumination area and the optical axis AX. Further, it is possible to secure the entrance pupil distance PD with a predetermined length or size. Note that there is no limitation to the configuration or construction of the respective specified embodiments, and also in a case that a part of the effective areas of the reflecting surfaces of the first to third reflecting mirrors M1 to M3 intersects or crosses the optical axis AX, the similar effects can be obtained by arranging a major part of the effective areas of the reflecting surfaces of the first to third reflecting mirrors M1 to M3 on the side of the illumination area of the mask 4 with respect to the optical axis AX. The imaging area of the image plane (wafer surface) and the illumination area of the object plane (mask surface) have an optically conjugate relationship.

Further, it is also possible to define the phrase "the first to third reflecting mirrors M1 to M3 are arranged only on the side of the illumination area of the mask 4 with respect to the optical axis AX" as meaning that, when the meridional surface including the optical axis AX of the reflective imaging optical system 6 and passing through the center of the illumination area of the mask 4 is set, the first, second, and third reflecting mirrors M1, M2 and M3 are arranged only in a space which contains the illumination area among spaces formed by dividing a space of the reflective imaging system 6 with a plane orthogonal to the meridional surface and including the optical axis AX.

Further, it is also possible to define the phrase "the first to third reflecting mirrors M1 to M3 are arranged on the side of the illumination area of the mask 4 with respect to the optical axis 4" as meaning that, when the meridional surface including the optical axis AX of the reflective imaging optical system 6 and passing through the center of the illumination area of the mask 4 is set, the first, second and third reflecting mirrors M1, M2 and M3 are arranged such that not less than 50% of the effective areas of the reflecting surfaces of the first to third reflecting mirrors N1 to M3 is included in a space which contains the illumination area among spaces formed by dividing a space of the reflective imaging system 6 with a plane orthogonal to the meridional surface and including the optical axis AX. Note the term "effective area of the reflecting surface" means an area surrounded by a light (light beam), which is generated from the object plane, on each of the reflecting surfaces. The main light is included in the effective area.

In the respective specified embodiments concerning the embodiment of the present invention, the aspherical surface is expressed by the following numerical expression (a) provided that y represents the height in the direction perpendicular to the optical axis, z represents the distance (sag amount) along the optical axis from the tangent plane, at the apex of the aspherical surface, to the position on the aspherical surface at the height y, r represents the apex radius of curvature, K represents the conical coefficient, and $C_n$ represents the n-order aspherical coefficient.

$$z=(y^2/r)/\{1+\{1-(1+\kappa)\cdot y^2/r^2\}^{1/2}\}+C_4\cdot y^4+C_6\cdot y^6+C_8\cdot y^8+C_{10}\cdot y^{10}+C_{12}\cdot y^{12}+C_{14}\cdot y^{14}+C_{16}\cdot y^{16}C_{18}\cdot y^{18}+C_{20}\cdot y^{20} \quad (a)$$

First Embodiment

FIG. 4 shows a construction of a reflective imaging optical system 6 according to a first embodiment of the embodiment of the present invention. With reference to FIG. 4, in the reflective imaging optical system 6 of the first embodiment, the light from the mask 4 is successively reflected by the concave reflecting surface of the first reflecting mirror M1, the convex reflecting surface of the second reflecting mirror M2, the concave reflecting surface of the third reflecting mirror M3, and the convex reflecting surface of the fourth reflecting mirror M4, the convex reflecting surface of the fifth reflecting mirror M5 and the concave reflecting surface of the sixth reflecting mirror M6 and then the intermediate image of the mask pattern is formed. The light from the intermediate image formed via the first reflective optical system G1 is successively reflected by the convex reflecting surface of the seventh reflecting mirror M7 and the concave reflecting surface of the eighth reflecting mirror M8, and then forms the reduced image (secondary image) of the mask pattern on the wafer 7. In the first embodiment, an aperture stop AS (not shown in the drawing) is arranged at a position of the reflecting surface of the fourth reflecting mirror M4.

Table 1 described below shows values of items or elements of the reflective imaging optical system according to the first embodiment. In the columns of the major items shown in Table 1, λ represents the wavelength of the exposure light, β represents the magnitude of the imaging magnification, NA represents the numerical aperture on the image side (wafer side), Y0 represents the radius (maximum image height) of the image circle IF on the wafer 7, LX represents the size or dimension in the X direction of the effective imaging area ER, and LY represents the size or dimension in the Y direction of the effective imaging area ER (widthwise dimension of the circular arc-shaped effective imaging area ER).

In the columns of the optical member items shown in Table 1, the surface number represents the sequence or order of the reflecting surface as counted from the mask side in the direction in which the light travels from the mask surface as the object plane (pattern surface of the mask 4) to the wafer surface as the image plane (transfer surface of the wafer 7), r represents the apex radius of curvature of each of the reflecting surfaces (center radius of curvature: mm), and d represents the spacing distance on the axis of each of the reflecting surfaces, i.e., the inter-surface spacing (mm). The sign of the inter-surface spacing d is changed every time when the reflection occurs. In the direction toward the mask, the radius of curvature of the convex surface is positive, and the radius of curvature of the concave surface is negative, irrelevant to the direction of the incidence of the light.

In the columns of the values corresponding to the conditional expression shown in Table 1, PD represents the distance (entrance pupil distance) along the optical axis between the entrance pupil and the mask surface, TT represents the distance (total length) along the optical axis between the mask surface and the wafer surface, and R represents the angle of incidence (rad) of the main light beam coming into the mask surface. The foregoing notation also holds in Tables 2 and 3 described later on in the same manner as described above.

TABLE 1

Major Items:

$\lambda = 13.5$ nm
$\beta = \frac{1}{4}$
NA = 0.45
Y0 = 73.65 mm
LX = 26 mm
LY = 1.3 mm Optical Member Items:

| Surface No. | r | d | Optical member |
|---|---|---|---|
| | (mask surface) | 584.272 | |
| 1 | −828.091 | −192.959 | (first reflecting mirror M1) |
| 2 | −501.139 | 1018.285 | (second reflecting mirror M2) |
| 3 | −1441.144 | −800.212 | (third reflecting mirror M3) |
| 4 | −1671.101 | 733.703 | (fourth reflecting mirror M4) |
| 5 | 1588.318 | −1143.099 | (fifth reflecting mirror M5) |
| 6 | 1889.753 | 2337.034 | (sixth reflecting mirror M6) |
| 7 | 954.211 | −419.868 | (seventh reflecting mirror M7) |
| 8 | 544.453 | 454.868 | (eighth reflecting mirror M8) |
| | (wafer surface) | | |

Aspherical Data:

First Surface:

$\kappa = 0$
$C_4 = -2.431091 \times 10^{-10}$  $C_6 = 1.392346 \times 10^{-15}$
$C_8 = -1.362462 \times 10^{-20}$  $C_{10} = 7.242589 \times 10^{-26}$ TABLE 1-continued $C_{12} = -2.543263 \times 10^{-31}$  $C_{14} = 4.822795 \times 10^{-37}$
$C_{16} = -3.954462 \times 10^{-43}$ Second Surface:

$\kappa = 0$
$C_4 = -6.655600 \times 10^{-10}$  $C_6 = 1.002270 \times 10^{-15}$
$C_8 = -8.218165 \times 10^{-20}$  $C_{10} = 1.006737 \times 10^{-24}$
$C_{12} = -1.201155 \times 10^{-29}$  $C_{14} = 5.355720 \times 10^{-35}$
$C_{16} = -1.157360 \times 10^{-40}$ Third Surface:

$\kappa = 0$
$C_4 = 1.157478 \times 10^{-11}$  $C_6 = 1.326608 \times 10^{-17}$
$C_8 = 7.664444 \times 10^{-24}$  $C_{10} = 4.854130 \times 10^{-30}$
$C_{12} = -7.348875 \times 10^{-36}$  $C_{14} = 9.765879 \times 10^{-41}$
$C_{16} = -1.272579 \times 10^{-46}$ Fourth Surface:

$\kappa = 0$
$C_4 = 1.210470 \times 10^{-10}$  $C_6 = 7.437886 \times 10^{-16}$
$C_8 = 1.173917 \times 10^{-20}$  $C_{10} = -4.480600 \times 10^{-25}$
$C_{12} = 4.737793 \times 10^{-29}$  $C_{14} = -2.283679 \times 10^{-33}$
$C_{16} = 4.334763 \times 10^{-38}$ Fifth Surface:

$\kappa = 0$
$C_4 = -1.448682 \times 10^{-10}$  $C_6 = -2.497657 \times 10^{-17}$
$C_8 = -2.263357 \times 10^{-22}$  $C_{10} = -1.712212 \times 10^{-27}$
$C_{12} = 1.670290 \times 10^{-32}$  $C_{14} = -1.140102 \times 10^{-37}$
$C_{16} = 2.594248 \times 10^{-43}$ Sixth Surface:

$\kappa = 0$
$C_4 = 6.154905 \times 10^{-14}$  $C_6 = 5.715594 \times 10^{-19}$
$C_8 = -9.712328 \times 10^{-25}$  $C_{10} = 1.544177 \times 10^{-30}$
$C_{12} = -1.417666 \times 10^{-36}$  $C_{14} = 7.555248 \times 10^{-43}$
$C_{16} = -1.774454 \times 10^{-49}$ Seventh Surface:

$\kappa = 0$
$C_4 = 2.315241 \times 10^{-9}$  $C_6 = 2.081549 \times 10^{-14}$
$C_8 = 2.514428 \times 10^{-19}$  $C_{10} = 3.819730 \times 10^{-24}$
$C_{12} = -5.824901 \times 10^{-29}$  $C_{14} = 1.240286 \times 10^{-33}$
$C_{16} = 8.073635 \times 10^{-39}$ Eighth Surface:

$\kappa = 0$
$C_4 = 4.649045 \times 10^{-11}$  $C_6 = 2.247828 \times 10^{-16}$
$C_8 = 8.934671 \times 10^{-22}$  $C_{10} = 3.093404 \times 10^{-27}$
$C_{12} = 1.945244 \times 10^{-32}$  $C_{14} = -4.313417 \times 10^{-38}$
$C_{16} = 6.674264 \times 10^{-43}$ Values Corresponding to Conditional Expression:

PD = 2233.5 mm
TT = 2572.0 mm
R = −0.130 rad
(1) (PD/TT)/R = −6.7

In relation to the reflective imaging optical system of the first embodiment, the value of RMS (root mean square: quadratic square mean) of the wavefront aberration was determined for the respective points in the circular arc-shaped effective imaging area ER. As a result, the maximum value (worst value) was 0.0076λ (λ: wavelength of light=13.5 nm). That is, in the first embodiment, it is possible to secure the relatively large numerical aperture on the image side of 0.45, and it is possible to secure the circular arc-shaped effective imaging area of 26 mm×1.3 mm in which the various aberrations are satisfactorily corrected on the wafer 7. Further, in the first embodiment, a spacing distance of not less than 8 mm is secured between each of the reflecting mirrors and the light flux passing along the vicinity of each of the reflecting mirrors. In the first embodiment, the aberration is corrected quite satisfactorily, as apparent from the comparison with other embodiments.

Second Embodiment

FIG. 5 shows a construction of a reflective imaging optical system 6 according to a second embodiment of the embodiment of the present invention. With reference to FIG. 5, the light from the mask 4 is also successively reflected by the concave reflecting surface of the first reflecting mirror M1, the convex reflecting surface of the second reflecting mirror M2, the concave reflecting surface of the third reflecting mirror M3, the convex reflecting surface of the fourth reflecting mirror M4, the convex reflecting surface of the fifth reflecting mirror M5, and the concave reflecting surface of the sixth reflecting mirror M6 and then the intermediate image of the mask pattern is formed also in the reflective imaging optical system 6 according to the second embodiment, in the same manner as in the first embodiment. The light from the intermediate image formed via the first reflective optical system G1 is successively reflected by the convex reflecting surface of the seventh reflecting mirror M7 and the concave reflecting surface of the eighth reflecting mirror M8, and then forms the reduced image of the mask pattern on the wafer 7. In the second embodiment also, an aperture stop AS (not shown in the drawing) is arranged at a position of the reflecting surface of the fourth reflecting mirror M4, in a similar manner as in the first embodiment. Table 2 described below shows values of items or elements of the reflective imaging optical system according to the second embodiment.

TABLE 2

Major Items:

$\lambda = 13.5$ nm
$\beta = \frac{1}{4}$
NA = 0.53
Y0 = 82.65 mm
LX = 26 mm
LY = 1.3 mm Optical Member Items:

| Surface No. | r | d | Optical member |
|---|---|---|---|
|  | (mask surface) | 814.452 |  |
| 1 | −754.335 | −171.003 | (first reflecting mirror M1) |
| 2 | −486.383 | 975.051 | (second reflecting mirror M2) |
| 3 | −1544.422 | −743.308 | (third reflecting mirror M3) |
| 4 | −1811.869 | 892.169 | (fourth reflecting mirror M4) |
| 5 | 1304.791 | −1252.560 | (fifth reflecting mirror M5) |
| 6 | 2135.095 | 2943.433 | (sixth reflecting mirror M6) |
| 7 | 958.987 | −386.813 | (seventh reflecting mirror M7) |
| 8 | 505.414 | 421.813 | (eighth reflecting mirror M8) |
|  | (wafer surface) |  |  |

Aspherical Data:

First Surface:

$\kappa = 0$
$C_4 = -1.932878 \times 10^{-10}$      $C_6 = 1.752289 \times 10^{-15}$
$C_8 = -1.245161 \times 10^{-20}$      $C_{10} = 5.310231 \times 10^{-26}$
$C_{12} = -1.439135 \times 10^{-31}$   $C_{14} = 2.194557 \times 10^{-37}$
$C_{16} = -1.522198 \times 10^{-43}$ Second Surface:

$\kappa = 0$
$C_4 = -3.850141 \times 10^{-10}$      $C_6 = 6.274626 \times 10^{-15}$
$C_8 = -1.534567 \times 10^{-19}$      $C_{10} = 1.932602 \times 10^{-24}$
$C_{12} = -1.581223 \times 10^{-29}$   $C_{14} = 6.834677 \times 10^{-35}$
$C_{16} = -1.361578 \times 10^{-40}$ Third Surface:

$\kappa = 0$
$C_4 = 1.945003 \times 10^{-11}$       $C_6 = 2.235580 \times 10^{-17}$
$C_8 = 2.024299 \times 10^{-23}$       $C_{10} = 3.934234 \times 10^{-29}$
$C_{12} = -1.291057 \times 10^{-34}$   $C_{14} = 7.789247 \times 10^{-40}$
$C_{16} = -1.060118 \times 10^{-45}$ Fourth Surface:

$\kappa = 0$
$C_4 = 4.112389 \times 10^{-11}$       $C_6 = 6.751536 \times 10^{-16}$
$C_8 = 7.838654 \times 10^{-21}$       $C_{10} = -3.039061 \times 10^{-25}$
$C_{12} = 1.746938 \times 10^{-29}$    $C_{14} = -5.832663 \times 10^{-34}$
$C_{16} = 7.331182 \times 10^{-39}$ Fifth Surface:

$\kappa = 0$
$C_4 = -1.658991 \times 10^{-10}$      $C_6 = 4.001351 \times 10^{-17}$
$C_8 = -1.049177 \times 10^{-22}$      $C_{10} = 5.596673 \times 10^{-29}$
$C_{12} = -8.777689 \times 10^{-35}$   $C_{14} = -5.122710 \times 10^{-41}$
$C_{16} = -2.088172 \times 10^{-46}$ Sixth Surface:

$\kappa = 0$
$C_4 = -4.894897 \times 10^{-13}$      $C_6 = -7.593369 \times 10^{-20}$
$C_8 = -1.032293 \times 10^{-26}$      $C_{10} = -2.796932 \times 10^{-33}$
$C_{12} = 1.037345 \times 10^{-39}$    $C_{14} = -5.674058 \times 10^{-46}$
$C_{16} = 1.120935 \times 10^{-52}$ Seventh Surface:

$\kappa = 0$
$C_4 = 2.989361 \times 10^{-9}$        $C_6 = 3.033907 \times 10^{-14}$
$C_8 = 3.106843 \times 10^{-19}$       $C_{10} = 2.687628 \times 10^{-24}$
$C_{12} = 1.141158 \times 10^{-28}$    $C_{14} = -7.696587 \times 10^{-33}$
$C_{16} = 2.009758 \times 10^{-37}$ Eighth Surface:

$\kappa = 0$
$C_4 = 7.175855 \times 10^{-11}$       $C_6 = 3.700717 \times 10^{-16}$
$C_8 = 1.736489 \times 10^{-21}$       $C_{10} = 5.249308 \times 10^{-27}$
$C_{12} = 7.536687 \times 10^{-32}$    $C_{14} = -3.517773 \times 10^{-37}$
$C_{16} = 2.988664 \times 10^{-42}$ Values Corresponding to Conditional Expression:

PD = 1910.8 mm
TT = 3493.2 mm
R = −0.170 rad
(1) (PD/TT)/R = −3.2

In relation to the reflective imaging optical system of the second embodiment, the maximum value (worst value) of RMS of the wavefront aberration was $0.0200\lambda$ ($\lambda$: wavelength of light=13.5 nm). That is, in the second embodiment, it is possible to secure the relatively large numerical aperture on the image side of 0.53, and it is possible to secure the circular arc-shaped effective imaging area of 26 mm×1.3 mm in which the various aberrations are satisfactorily corrected on the wafer 7. Further, in the second embodiment, a spacing distance of not less than 8 mm is secured between each of the reflecting mirrors and the light flux passing along the vicinity of each of the reflecting mirrors, in the same manner as in the first embodiment. In the second embodiment, quite a large numerical aperture on the image side is secured although the total length TT is relatively large, as apparent from comparison with the other embodiments.

Third Embodiment

Figure 6:
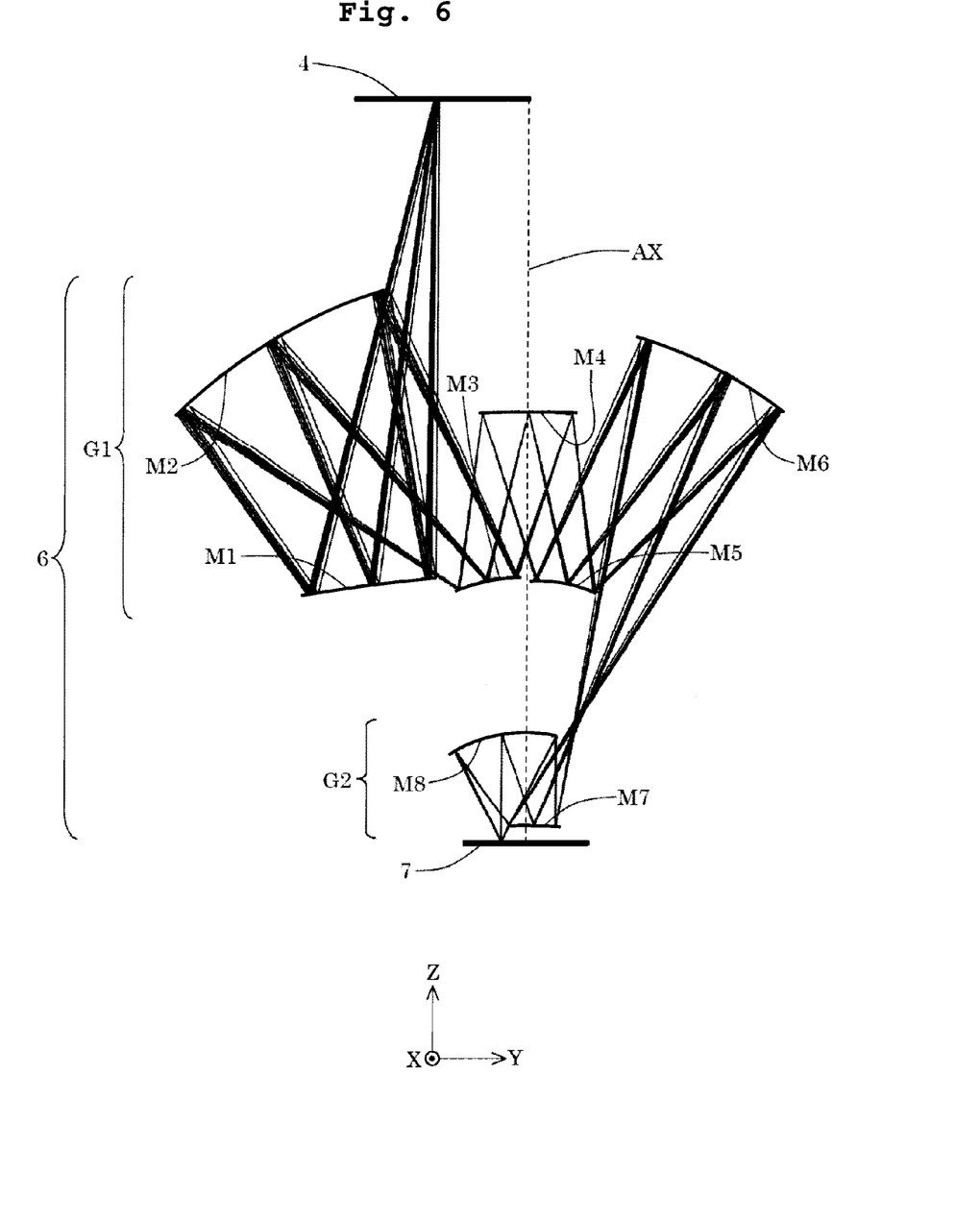
FIG. 6 schematically shows a construction of a reflective imaging optical system according to a third embodiment.

FIG. 6 shows a construction of a reflective imaging optical system according to a third embodiment of the embodiment of the present invention. With reference to FIG. 6, the light from the mask 4 is successively reflected by the convex reflecting surface of the first reflecting mirror M1, the concave reflecting surface of the second reflecting mirror M2, the convex reflecting surface of the third reflecting mirror M3, the concave reflecting surface of the fourth reflecting mirror M4, the convex reflecting surface of the fifth reflecting mirror M5, and the concave reflecting surface of the sixth reflecting mirror M6 and then the intermediate image of the mask pattern is formed in the reflective imaging optical system 6 of the third embodiment. The light from the intermediate image formed via the first reflective optical system G1 is successively reflected by the convex reflecting surface of the seventh reflecting mirror M7 and the concave reflecting surface of the eighth reflecting mirror M8, and then forms the reduced image of the mask pattern on the wafer 7. In the third embodiment, an aperture stop AS (not shown in the drawing) is arranged at a position of the reflecting surface of the fourth reflecting mirror M4. Table 3 described below shows values of items or elements of the reflective imaging optical system according to the third embodiment.

TABLE 3

Major Items:

$\lambda = 13.5$ nm
$\beta = \frac{1}{4}$
NA = 0.45
Y0 = 53.75 mm
LX = 26 mm
LY = 1.5 mm Optical Member Items:

| Surface No. | r | d | Optical member |
|---|---|---|---|
|  | (mask surface) | 1092.802 |  |
| 1 | 2566.206 | −702.769 | (first reflecting mirror M1) |
| 2 | 1097.252 | 704.985 | (second reflecting mirror M2) |
| 3 | 375.946 | −377.671 | (third reflecting mirror M3) |
| 4 | 1046.067 | 385.524 | (fourth reflecting mirror M4) |
| 5 | 466.502 | −595.107 | (fifth reflecting mirror M5) |
| 6 | 925.366 | 1159.911 | (sixth reflecting mirror M6) |
| 7 | 989.719 | −212.563 | (seventh reflecting mirror M7) |
| 8 | 307.146 | 251.018 | (eighth reflecting mirror M8) |
|  | (wafer surface) |  |  |

Aspherical Data:

First Surface:

$\kappa = 0$
$C_4 = 1.205722 \times 10^{-11}$   $C_6 = -1.876185 \times 10^{-16}$
$C_8 = 1.982933 \times 10^{-21}$   $C_{10} = -1.574742 \times 10^{-26}$
$C_{12} = 8.797994 \times 10^{-32}$   $C_{14} = -3.323494 \times 10^{-37}$
$C_{16} = 8.103956 \times 10^{-43}$   $C_{18} = -1.147857 \times 10^{-48}$
$C_{20} = 7.147058 \times 10^{-55}$ Second Surface:

$\kappa = 0$
$C_4 = 3.089220 \times 10^{-12}$   $C_6 = 1.868684 \times 10^{-18}$
$C_8 = 1.009752 \times 10^{-23}$   $C_{10} = -1.694273 \times 10^{-29}$
$C_{12} = 5.349203 \times 10^{-35}$   $C_{14} = -9.961554 \times 10^{-41}$
$C_{16} = 1.529042 \times 10^{-46}$   $C_{18} = -1.379884 \times 10^{-52}$
$C_{20} = 6.426020 \times 10^{-59}$ Third Surface:

$\kappa = 0$
$C_4 = 6.773031 \times 10^{-10}$   $C_6 = 1.013672 \times 10^{-14}$
$C_8 = 3.050660 \times 10^{-19}$   $C_{10} = -1.125311 \times 10^{-23}$
$C_{12} = 8.257974 \times 10^{-28}$   $C_{14} = -3.166158 \times 10^{-32}$
$C_{16} = 7.682952 \times 10^{-37}$   $C_{18} = -8.807859 \times 10^{-42}$
$C_{20} = 2.580491 \times 10^{-47}$ Fourth Surface:

$\kappa = 0$
$C_4 = -3.859402 \times 10^{-10}$   $C_6 = -3.000793 \times 10^{-16}$
$C_8 = 1.448338 \times 10^{-20}$   $C_{10} = 4.421557 \times 10^{-24}$
$C_{12} = -1.026669 \times 10^{-27}$   $C_{14} = 1.580136 \times 10^{-31}$
$C_{16} = -1.424469 \times 10^{-35}$   $C_{18} = 6.979719 \times 10^{-40}$
$C_{20} = -1.432263 \times 10^{-44}$ TABLE 3-continued Fifth Surface:

$\kappa = 0$
$C_4 = -1.196402 \times 10^{-9}$   $C_6 = -3.954579 \times 10^{-15}$
$C_8 = -1.648838 \times 10^{-20}$   $C_{10} = -3.397029 \times 10^{-26}$
$C_{12} = -5.325987 \times 10^{-29}$   $C_{14} = 5.274771 \times 10^{-33}$
$C_{16} = -2.272322 \times 10^{-37}$   $C_{18} = 5.011794 \times 10^{-42}$
$C_{20} = -4.551381 \times 10^{-47}$ Sixth Surface:

$\kappa = 0$
$C_4 = 1.863267 \times 10^{-12}$   $C_6 = 1.325253 \times 10^{-17}$
$C_8 = -7.716640 \times 10^{-23}$   $C_{10} = 5.703774 \times 10^{-28}$
$C_{12} = -2.493137 \times 10^{-33}$   $C_{14} = 7.450082 \times 10^{-39}$
$C_{16} = -1.407474 \times 10^{-44}$   $C_{18} = 1.543832 \times 10^{-50}$
$C_{20} = -7.275082 \times 10^{-57}$ Seventh Surface:

$\kappa = 0$
$C_4 = 6.602372 \times 10^{-9}$   $C_6 = 1.788732 \times 10^{-13}$
$C_8 = 5.120573 \times 10^{-18}$   $C_{10} = -3.580904 \times 10^{-22}$
$C_{12} = 2.661497 \times 10^{-25}$   $C_{14} = -7.585320 \times 10^{-29}$
$C_{16} = 1.279990 \times 10^{-32}$   $C_{18} = -1.195787 \times 10^{-36}$
$C_{20} = 4.824295 \times 10^{-41}$ Eighth Surface:

$\kappa = 0$
$C_4 = 5.193038 \times 10^{-10}$   $C_6 = 6.726435 \times 10^{-15}$
$C_8 = 7.722663 \times 10^{-20}$   $C_{10} = 9.485048 \times 10^{-25}$
$C_{12} = 1.071102 \times 10^{-29}$   $C_{14} = 7.691182 \times 10^{-35}$
$C_{16} = 4.030377 \times 10^{-39}$   $C_{18} = -3.560428 \times 10^{-44}$
$C_{20} = 7.786315 \times 10^{-49}$ Values Corresponding to Conditional Expression:

PD = 1758.2 mm
TT = 1706.1 mm
R = −0.120 rad
(1) (PD/TT)/R = −8.6

In relation to the reflective imaging optical system of the third embodiment, the maximum value (worst value) of RMS of the wavefront aberration was $0.0107\lambda$ ($\lambda$: wavelength of light=13.5 nm). That is, in the third embodiment, it is possible to secure the relatively large numerical aperture on the image side of 0.45, and it is possible to secure the circular arc-shaped effective imaging area of 26 mm×1.5 mm in which the various aberrations are satisfactorily corrected on the wafer. Further, in the third embodiment, a spacing distance of not less than 8 mm is secured between each of the reflecting mirrors and the light flux passing along the vicinity of each of the reflecting mirrors, in the same manner as in the first and second embodiments. In the third embodiment, the total length TT is suppressed to be quite small, as apparent from comparison with the other embodiments.

In the respective specified embodiments, since it is possible to set the distance between the mask 4 and the second reflecting mirror M2 to be long, the oblique incident mirror 3 can be arranged easily. For example, a distance $R_{M-M2}$ between the mask 4 and the second reflecting mirror M2 is capable of fulfilling a relationship of $R_{M-M2}/TT>0.1$, with respect to the distance (total length) TT along the optical axis between the mask surface and the wafer surface.

Further, in the respective specified embodiments, the angle of incidence of the light coming into the fourth reflecting mirror M4 is made to be not more than 30 degrees. By doing so, it is possible to lower the unevenness in intensity at the pupil position.

In the respective specified embodiments described above, it is possible to secure the satisfactory imaging performance and the relatively large numerical aperture on the image side of 0.45 to 0.53, and it is possible to secure the circular arc-shaped effective imaging area of 26 mm×1.3 mm to 1.5 mm in which the various aberrations are satisfactorily corrected on the wafer 7, with respect to the EUV light having the wavelength of 13.5 nm. Therefore, the pattern of the mask 4 can be transferred at the high resolution of not more than 0.1 μm by the scanning exposure to each of the exposure areas having the size of, for example, 26 mm×34 mm or 26 mm×37 mm on the wafer 7.

In the respective specified embodiments described above, the EUV light having the wavelength of 13.5 nm is used by way of example. However, there is no limitation to this. The present invention is also applicable similarly or equivalently to a reflective imaging optical system which uses, for example, the EUV light having a wavelength of about 5 nm to 40 nm or any other light having an appropriate wavelength.

In the respective specified embodiments described above, the reflective imaging optical system 6 includes the eight reflecting mirrors M1 to M8 wherein the centers of curvature of the reflecting surfaces are arranged on the same axis (on the optical axis AX). However, at least one of the eight reflecting mirrors M1 to M8 may be provided such that the center of curvature of the reflecting surface is deviated or shifted from the optical axis AX. In the respective specified embodiments described above, all of the reflecting mirrors M1 to M8 have the reflecting surfaces which are formed along the surfaces rotationally symmetrical an infinite number of times in relation to the optical axis AX. However, at least one of the reflecting mirrors N1 to M8 may have a reflecting surface which is formed along a surface rotationally symmetrical a finite number of times (for example, once, twice, three times).

The exposure apparatus of the embodiment described above is produced by assembling the various subsystems including the respective constitutive elements as defined in claims so that the predetermined mechanical accuracy, electric accuracy and optical accuracy are maintained. In order to secure the various accuracies, those performed before and after the assembling include the adjustment for achieving the optical accuracy for the various optical systems, the adjustment for achieving the mechanical accuracy for the various mechanical systems, and the adjustment for achieving the electric accuracy for the various electric systems. The steps of assembling the various subsystems into the exposure apparatus include, for example, the mechanical connection, the wiring connection of the electric circuits, and the piping connection of the air pressure circuits in correlation with the various subsystems. It goes without saying that the steps of assembling the respective individual subsystems are performed before performing the steps of assembling the various subsystems into the exposure apparatus. When the steps of assembling the various subsystems into the exposure apparatus are completed, the overall adjustment is performed to secure the various accuracies as the entire exposure apparatus. The exposure apparatus may be produced in a clean room in which the temperature, the cleanness, etc. are managed.

Figure 7:
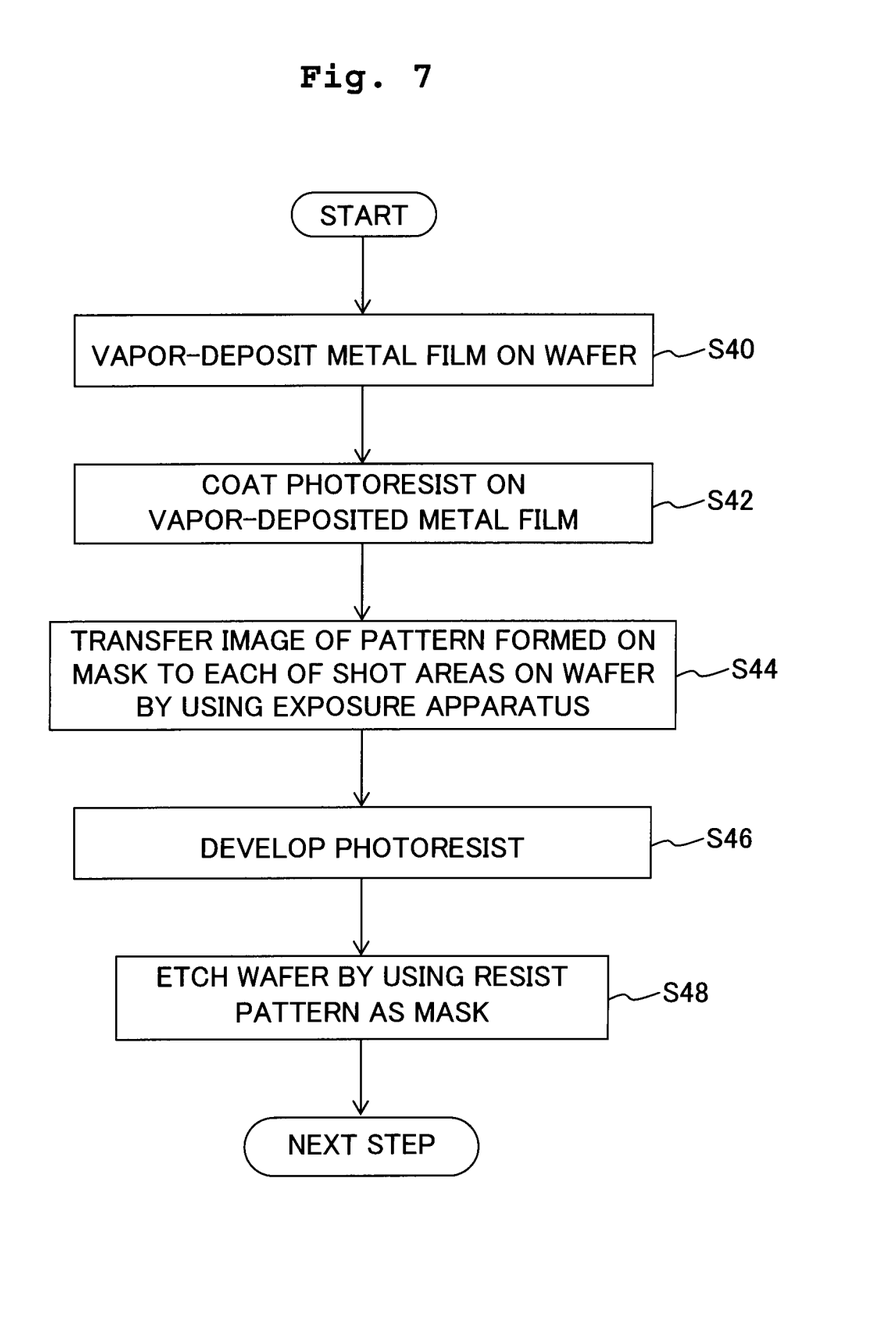
FIG. 7 shows a flow chart concerning an exemplary technique adopted when a semiconductor device is obtained as a microdevice by way of example.

Next, an explanation will be made about a device production method using the exposure apparatus according to the embodiment described above. FIG. 7 shows a flow chart illustrating steps of producing a semiconductor device. As shown in FIG. 7, in the steps of producing the semiconductor device, a metal film is vapor-deposited on a wafer W which is to serve as a substrate of the semiconductor device (Step S40); and a photoresist as a photosensitive material is coated on the vapor-deposited metal film (Step S42). Subsequently, a pattern formed on a mask (reticle) M is transferred to each of shot areas on the wafer W by using the exposure apparatus of the embodiment described above (Step S44: exposure step). The wafer W for which the transfer has been completed is developed, i.e., the photoresist, to which the pattern has been transferred, is developed (Step S46: development step).

After that, the resist pattern, which is formed on the surface of the wafer W in accordance with Step S46, is used as a mask to perform the processing including, for example, the etching with respect to the surface of the wafer W (Step S48: processing step).

The resist pattern herein refers to the photoresist layer formed with protrusions and recesses having shapes corresponding to the pattern transferred by the exposure apparatus of the embodiment described above, wherein the recesses penetrate through the photoresist layer. In Step S48, the surface of the wafer W is processed via the resist pattern. The processing, which is performed in Step S48, includes, for example, at least one of the etching of the surface of the wafer W and the film formation of a metal film or the like. In Step S44, the exposure apparatus of the embodiment described above transfers the pattern by using, as the photosensitive substrate, the wafer W coated with the photoresist.

In the embodiment described above, the laser plasma X-ray light source is used as the light source for supplying the EUV light. However, there is no limitation to this. It is also possible to use, for example, the synchrotron radiation (SOR) light as the EUV light.

In the embodiment described above, the present invention is applied to the exposure apparatus having the light source for supplying the EUV light. However, there is no limitation to this. The present invention is also applicable to an exposure apparatus having a light source for supplying a light having any wavelength other than the EUV light.

In the embodiment described above, it is possible to use a variable pattern-forming apparatus for dynamically forming a predetermined pattern based on predetermined electronic data, instead of using the mask M. It is possible to use, as such a variable pattern-forming apparatus, for example, DMD (digital micromirror device) including a plurality of reflecting elements which are driven based on predetermined electronic data. The exposure apparatus, which uses DMD, is disclosed, for example, in United States Patent Application Publication Nos. 2007/0296936 and 2009/0122381.

In the embodiment described above, the present invention is applied to the reflective imaging optical system of the far pupil type provided as the projection optical system of the exposure apparatus. However, there is no limitation to this. In general, the present invention is also applicable similarly or equivalently to any reflective imaging optical system of the near pupil type in which an image of a first plane is formed on a second plane.

What is claimed is:

1. A reflective imaging optical system which forms, on a second plane, an image of a predetermined area on a first plane, the reflective imaging optical system comprising:
    a first reflecting mirror, a second reflecting mirror, a third reflecting mirror, a fourth reflecting mirror, a fifth reflecting mirror, a sixth reflecting mirror, a seventh reflecting mirror and an eighth reflecting mirror which are arranged in an order of reflection from the first plane toward the second plane; and
    an entrance pupil which is positioned on a side opposite to the reflective imaging optical system with respect to the first plane intervening therebetween;
    wherein the following condition is fulfilled provided that PD represents a distance along an optical axis between the entrance pupil and the first plane, TT represents a distance along the optical axis between the first plane and the second plane, and R represents an angle of incidence (rad) of a main light beam coming into the first plane:

$$-14.3 < (PD/TT)/R < -2.5.$$

2. The reflective imaging optical system according to claim 1, wherein a condition of $-12.0 < (PD/TT)/R < -2.7$ is fulfilled.

3. The reflective imaging optical system according to claim 1, wherein a condition of $-10.0 < (PD/TT)/R < -3.0$ is fulfilled.

4. The reflective imaging optical system according to claim 1, wherein the first to sixth reflecting mirrors form a position conjugate with the predetermined area on the first plane; and
the seventh and eighth reflecting mirrors form the image on the second plane based on a light from the conjugate position.

5. The reflective imaging optical system according to claim 4, wherein there is no position conjugate with the predetermined area on the first plane in an optical path between the first reflecting mirror and the sixth reflecting mirror.

6. The reflective imaging optical system according to claim 1, wherein the first reflecting mirror has a concave reflecting surface, the second reflecting mirror has a convex reflecting surface, and the third reflecting mirror has a concave reflecting surface.

7. The reflective imaging optical system according to claim 1, further comprising an aperture stop which is arranged in an optical path ranging from the third reflecting mirror to the fifth reflecting mirror.

8. The reflective imaging optical system according to claim 7, wherein the aperture stop is arranged at a position of a reflecting surface of the fourth reflecting mirror or at a position in the vicinity of the reflecting surface.

9. The reflective imaging optical system according to claim 1, wherein the first to third reflecting mirrors are arranged on a side of the predetermined area with respect to the optical axis.

10. The reflective imaging optical system according to claim 9, wherein the first to third reflecting mirrors are arranged only on the side of the predetermined area with respect to the optical axis.

11. The reflective imaging optical system according to claim 1, wherein the optical axis has a form of a straight line; and
the first to eighth reflecting mirrors are arranged so that centers of curvature of reflecting surfaces of the first to eighth reflecting mirrors are positioned on the optical axis having the form of a straight line.

12. The reflective imaging optical system according to claim 11, wherein the reflecting surfaces of the first to eighth reflecting mirrors are each formed along a surface rotationally symmetric in relation to the optical axis.

13. The reflective imaging optical system according to claim 1, wherein a reduced image of the predetermined area is formed on the second plane.

14. The reflective imaging optical system according to claim 1, wherein the reflective imaging optical system is an optical system which is telecentric on a side of the second plane.

15. The reflective imaging optical system according to claim 1, wherein the entrance pupil has no shielding area.

16. A reflective imaging optical system which forms, on a second plane, an image of a predetermined area on a first plane, the reflective imaging optical system comprising:
a first reflecting mirror, a second reflecting mirror, a third reflecting mirror, a fourth reflecting mirror, a fifth reflecting mirror, a sixth reflecting mirror, a seventh reflecting mirror and an eighth reflecting mirror which are arranged in an order of reflection from the first plane toward the second plane; and
an entrance pupil which is positioned on a side opposite to the reflective imaging optical system with respect to the first plane intervening therebetween;
wherein the first to third reflecting mirrors are arranged on a side of the predetermined area with respect to an optical axis, and the first reflecting mirror is arranged such that a light from the predetermined area is reflected to a position between an optical path ranging from the predetermined area to the first reflecting mirror and the optical axis.

17. The reflective imaging optical system according to claim 16, wherein the first to third reflecting mirrors are arranged only on the side of the predetermined area with respect to the optical axis.

18. The reflective imaging optical system according to claim 16, further comprising an aperture stop which is arranged in an optical path ranging from the third reflecting mirror to the fifth reflecting mirror.

19. The reflective imaging optical system according to claim 18, wherein the aperture stop is arranged at a position of a reflecting surface of the fourth reflecting mirror or at a position in the vicinity of the reflecting surface.

20. The reflective imaging optical system according to claim 16, wherein the following condition is fulfilled provided that PD represents a distance along the optical axis between the entrance pupil and the first plane, TT represents a distance along the optical axis between the first plane and the second plane, and R represents an angle of incidence (rad) of a main light beam coming into the first plane:

$$-14.3 < (PD/TT)/R < -2.5.$$

21. The reflective imaging optical system according to claim 20, wherein a condition of $-12.0 < (PD/TT)/R < -2.7$ is fulfilled.

22. The reflective imaging optical system according to claim 20, wherein a condition of $-10.0 < (PD/TT)/R < -3.0$ is fulfilled.

23. The reflective imaging optical system according to claim 16, wherein the first to sixth reflecting mirrors form a position conjugate with the predetermined area on the first plane; and
the seventh and eighth reflecting mirrors form the image on the second plane based on a light from the conjugate position.

24. The reflective imaging optical system according to claim 23, wherein there is no position conjugate with the predetermined area on the first plane in an optical path between the first reflecting mirror and the sixth reflecting mirror.

25. The reflective imaging optical system according to claim 16, wherein the first reflecting mirror has a concave reflecting surface, the second reflecting mirror has a convex reflecting surface, and the third reflecting mirror has a concave reflecting surface.

26. The reflective imaging optical system according to claim 16, wherein the optical axis has a form of a straight line; and
the first to eighth reflecting mirrors are positioned so that centers of curvature of reflecting surfaces of the first to eighth reflecting mirrors are positioned on the optical axis having the form of a straight line.

27. The reflective imaging optical system according to claim 26, wherein the reflecting surfaces of the first to eighth reflecting mirrors are each formed along a surface rotationally symmetric in relation to the optical axis.

28. The reflective imaging optical system according to claim 16, wherein a reduced image of the predetermined area is formed on the second plane.

29. The reflective imaging optical system according to claim 16, wherein the reflective imaging optical system is an optical system which is telecentric on a side of the second plane.

30. The reflective imaging optical system according to claim 16, wherein the entrance pupil has no shielding area.

31. An exposure apparatus comprising:
an illumination optical system which illuminates a predetermined pattern arranged on the first plane with a light from a light source; and
the reflective imaging optical system as defined in claim 1 which projects the predetermined pattern onto a photosensitive substrate arranged on the second plane.

32. The exposure apparatus according to claim 31, wherein an exit pupil of the illumination optical system is coincident with the entrance pupil of the reflective imaging optical system.

33. The exposure apparatus according to claim 32, wherein the illumination optical system comprises a first fly's eye optical system which has a plurality of first reflecting optical elements and a second fly's eye optical system which has a plurality of second reflecting optical elements arranged in parallel to correspond to the plurality of first reflecting optical elements; and
a reflecting surface of the second fly's eye optical system is arranged on the exit pupil of the illumination optical system.

34. The exposure apparatus according to claim 33, wherein no reflecting mirror having a power is arranged in an optical path ranging from the second fly's eye optical system and the first plane.

35. The exposure apparatus according to claim 31, wherein the light supplied from the light source is an EUV light having a wavelength of 5 nm to 40 nm; and
the predetermined pattern is projected onto the photosensitive substrate to expose the photosensitive substrate therewith by moving the predetermined pattern and the photosensitive substrate relative to the reflective imaging optical system.

36. A method for producing a device, comprising:
exposing the photosensitive substrate with the predetermined pattern by using the exposure apparatus as defined in claim 31;
developing the photosensitive substrate to which the predetermined pattern has been transferred to form a mask layer, which has a shape corresponding to the predetermined pattern, on a surface of the photosensitive substrate; and
processing the surface of the photosensitive substrate via the mask layer.

37. An exposure apparatus comprising:
an illumination optical system which illuminates a predetermined pattern arranged on the first plane with a light from a light source; and
the reflective imaging optical system as defined in claim 16 which projects the predetermined pattern onto a photosensitive substrate arranged on the second plane.

38. The exposure apparatus according to claim 37, wherein an exit pupil of the illumination optical system is coincident with an entrance pupil of the reflective imaging optical system.

39. The exposure apparatus according to claim 38, wherein the illumination optical system comprises a first fly's eye optical system which has a plurality of first reflecting optical elements and a second fly's eye optical system which has a plurality of second reflecting optical elements arranged in parallel to correspond to the plurality of first reflecting optical elements; and
a reflecting surface of the second fly's eye optical system is arranged on the exit pupil of the illumination optical system.

40. The exposure apparatus according to claim 39, wherein no reflecting mirror having a power is arranged in an optical path ranging from the second fly's eye optical system and the first plane.

41. The exposure apparatus according to claim 37, wherein the light supplied from the light source is an EUV light having a wavelength of 5 nm to 40 nm; and
the predetermined pattern is projected onto the photosensitive substrate to expose the photosensitive substrate therewith by moving the predetermined pattern and the photosensitive substrate relative to the reflective imaging optical system.

42. A method for producing a device, comprising:
exposing the photosensitive substrate with the predetermined pattern by using the exposure apparatus as defined in claim 37;
developing the photosensitive substrate to which the predetermined pattern has been transferred to form a mask layer, which has a shape corresponding to the predetermined pattern, on a surface of the photosensitive substrate; and
processing the surface of the photosensitive substrate via the mask layer.

43. The reflective imaging optical system according to claim 16, wherein the second reflecting mirror is arranged at the position between the optical path ranging from the predetermined area to the first reflecting mirror and the optical axis.

44. The reflective imaging optical system according to claim 43, wherein the second reflecting mirror is arranged such that a light from the first reflecting mirror is reflected to a position between an optical path ranging from the first reflecting mirror to the second reflecting mirror and the optical axis.

45. The reflective imaging optical system according to claim 16, wherein, among the first to eighth reflecting mirrors, only the first to third reflecting mirrors are arranged only on the side of the predetermined area with respect to the optical axis.

46. The reflective imaging optical system according to claim 45, wherein at least one of the fifth reflecting mirror and the sixth reflecting mirror is arranged only on a side opposite to the side of the first to third reflecting mirrors with respect to the optical axis.

47. The reflective imaging optical system according to claim 16, wherein each of the first to eighth reflecting mirrors does not have an aperture through which a light from the first plane to the second plane passes.

48. The reflective imaging optical system according to claim 16, wherein the second reflecting mirror is a convex mirror.

49. A reflective imaging optical system which forms, on a second plane, an image of a predetermined area on a first plane, the reflective imaging optical system comprising a first reflecting mirror, a second reflecting mirror, a third reflecting mirror, a fourth reflecting mirror, a fifth reflecting mirror, a sixth reflecting mirror, a seventh reflecting mirror and an eighth reflecting mirror which are arranged in an order of reflection from the first plane toward the second plane, wherein an entrance pupil of the reflective imaging optical system is positioned on a side opposite to the reflective imaging optical system with respect to the first plane intervening therebetween,
the first to third reflecting mirrors are arranged on a side of the predetermined area with respect to an optical axis,
six mirrors out of the first to eighth reflecting mirrors form a six-mirror partial objective, and
the third reflecting mirror is a convex mirror.

* * * * *